US008818775B2

(12) United States Patent
Endres et al.

(10) Patent No.: US 8,818,775 B2
(45) Date of Patent: Aug. 26, 2014

(54) METHODS OF DESIGNING EARTH-BORING TOOLS USING A PLURALITY OF WEAR STATE VALUES AND RELATED METHODS OF FORMING EARTH-BORING TOOLS

(75) Inventors: Lance A. Endres, Spring, TX (US); Tyler R. Reynolds, The Woodlands, TX (US); Gregory C. Prevost, Spring, TX (US)

(73) Assignee: Baker Hughes Incorporated, Houston, TX (US)

( * ) Notice: Subject to any disclaimer, the term of this patent is extended or adjusted under 35 U.S.C. 154(b) by 452 days.

(21) Appl. No.: 13/204,402

(22) Filed: Aug. 5, 2011

(65) Prior Publication Data
US 2013/0035902 A1    Feb. 7, 2013

(51) Int. Cl.
*G06G 7/48* (2006.01)
*G06F 17/50* (2006.01)
*E21B 10/00* (2006.01)
*E21B 10/08* (2006.01)
*E21B 10/16* (2006.01)
*E21B 44/00* (2006.01)

(52) U.S. Cl.
CPC ............ *G06F 17/5086* (2013.01); *E21B 10/00* (2013.01); *E21B 10/08* (2013.01); *E21B 10/16* (2013.01); *E21B 44/00* (2013.01)
USPC .................................. 703/7; 703/10; 175/327

(58) Field of Classification Search
CPC ....... G06F 17/5086; E21B 1/00; E21B 10/00; E21B 10/08; E21B 10/16; E21B 44/00
USPC ........................................................ 703/7, 10
See application file for complete search history.

(56) References Cited

U.S. PATENT DOCUMENTS

| 3,491,844 | A | 1/1970 | Kelly, Jr. |
| 5,042,596 | A | 8/1991 | Brett et al. |
| 6,516,293 | B1 | 2/2003 | Huang et al. |
| 6,619,411 | B2 | 9/2003 | Singh et al. |
| 6,879,947 | B1 | 4/2005 | Glass |
| 7,302,374 | B2 | 11/2007 | Singh et al. |
| 7,693,695 | B2 | 4/2010 | Huang et al. |
| 7,844,426 | B2 * | 11/2010 | Huang .............................. 703/6 |

(Continued)

OTHER PUBLICATIONS

Rashidi et al, "Real-Time Drill Bit Wear Prediction by Combining Rock Energy and Drilling Strength Concepts", SPE 117109, 2008.*
Glowka et al, "Implications of Thermal Wear Phenomena for PDC Bit Design and Operation", SPE 14222, 1985.*

(Continued)

*Primary Examiner* — Mary C Jacob
(74) *Attorney, Agent, or Firm* — TraskBritt (57) ABSTRACT

Methods of designing an earth-boring tool are described, including calculating one or more performance parameters based on drilling conditions, a plurality of wear state values, and a set of values of other design variables. Methods of enhancing a performance parameter in the design of an earth-boring tool are also described, including calculating the performance parameter based at least partially on a plurality of wear state values and a first set of values of other design variables, calculating the performance parameter based at least partially on the plurality of wear state values and a second set of values of design variables different than the first set, and comparing the calculated performance parameters to determine which of the first and the second set is closer to a target range or value across a range of the plurality of wear state values. Related methods of forming an earth-boring tool are also described.

14 Claims, 5 Drawing Sheets

(56) References Cited

U.S. PATENT DOCUMENTS

| | | |
|---|---|---|
| 7,860,696 B2 | 12/2010 | Chen |
| 7,899,658 B2 | 3/2011 | Oliver et al. |
| 8,185,366 B2 * | 5/2012 | Huang et al. ............... 703/7 |
| 8,437,995 B2 * | 5/2013 | Matthews et al. ............. 703/7 |
| 2004/0104053 A1 | 6/2004 | Chen |

OTHER PUBLICATIONS

Hanson et al., "Dynamics Modeling of PDC Bits," 1995 SPE/IADC Drilling Conference, Amsterdam (1995) pp. 589-604.

Dykstra et al., "Improving Drilling Performance by Applying Advanced Dynamics Models," 2001 SPE/IADC Drilling Conference, Amsterdam (2001) pp. 1-18.

* cited by examiner

FIG. 5

METHODS OF DESIGNING EARTH-BORING TOOLS USING A PLURALITY OF WEAR STATE VALUES AND RELATED METHODS OF FORMING EARTH-BORING TOOLS

TECHNICAL FIELD

Embodiments of the present disclosure relate generally to methods of designing earth-boring tools for drilling subterranean formations, such as drill bits. Some embodiments relate to methods of designing earth-boring tools including enhancing one or more performance parameters of earth-boring tools using a plurality of wear state values of the earth-boring tools. Some embodiments of the disclosure also relate to methods of forming earth-boring tools for drilling subterranean formations including designing the earth-boring tools using a plurality of wear state values of the earth-boring tools.

BACKGROUND

Wellbores are formed in subterranean formations for various purposes including, for example, the extraction of oil and gas from a subterranean formation and the extraction of geothermal heat from a subterranean formation. A wellbore may be formed in a subterranean formation using a drill bit, such as, for example, an earth-boring rotary drill bit. Different types of earth-boring rotary drill bits are known in the art, including, for example, fixed-cutter bits (which are often referred to in the art as "drag" bits), rolling-cutter bits (which are often referred to in the art as "rock" bits), impregnated bits (impregnated with diamonds or other abrasive particles), and hybrid bits (which may include, for example, both fixed cutters and rolling cutters).

An earth-boring drill bit is typically mounted on the lower end of a drill string and is rotated by rotating the drill string at the surface or by actuation of downhole motors or turbines, or by both methods. The drill string comprises a series of elongated tubular segments connected end-to-end that extends into the wellbore from the surface of the formation. When weight or other axial force is applied to the drill string and consequently to the drill bit, the rotating bit engages the formation and proceeds to form a wellbore. The weight or other force used to push the drill bit into and against the formation is often referred to as "weight-on-bit" (WOB). As the drill bit rotates, the cutters or abrasive structures thereof cut, crush, shear, and/or abrade away the formation material to form the wellbore. The rate at which the drill bit proceeds into the formation is often referred to as "rate of penetration" (ROP). With each revolution of the drill bit, the drill bit proceeds into the formation a distance, often referred to as "depth of cut" (DOC). The ROP and DOC may be related to the type of drill bit used, the WOB, the rate at which the drill bit rotates (i.e., the "revolutions per minute" (RPM)), the number of cutters or abrasive particles on the drill bit, the location or arrangement of the cutters or abrasive particles on the drill bit, the hardness of the formation material, etc.

Figure 1A:
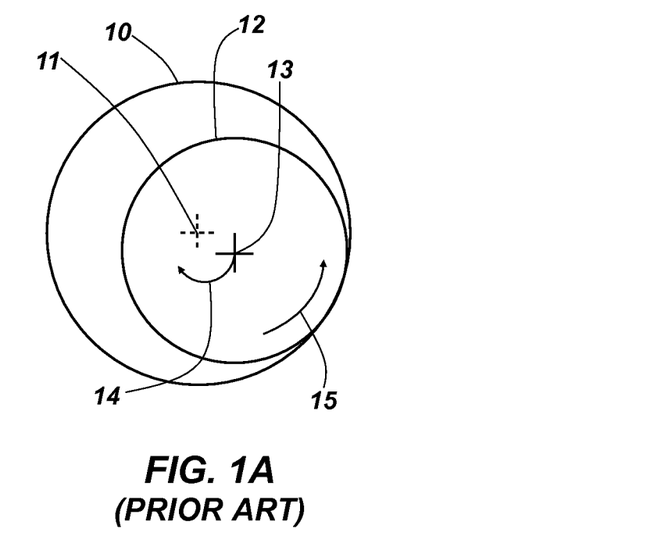
FIGS. 1A and 1B are bottom views of a prior art earth-boring drill bit in a wellbore experiencing backwards whirl and forward synchronous rotation, respectively.
Figure 1B:
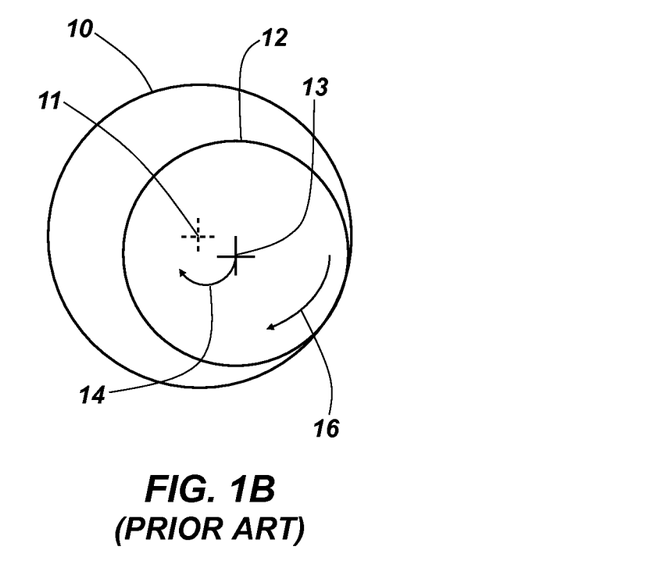

During drilling of a formation, drill bits may wear down and become damaged, causing them to be less effective at drilling and maintaining a desirable (i.e., high) ROP. Lateral vibrations during drilling may cause a drill bit to rotate about, but offset from, the center of a borehole in an unstable fashion. This rotation about the center of the borehole is often referred to as "bit whirl" or "backwards whirl," terms often used to describe a drill bit rotating about the center of a borehole in an opposite direction as the rotation of the drill bit and drill string as a whole. For example, FIG. 1A illustrates a borehole 10 with a drill bit 12 inside the borehole 10 experiencing backwards whirl. The drill bit 12 is rotating about its axis 13 in a counterclockwise direction 15. However, the drill bit 12, as a whole, rotates about an axis 11 of the borehole 10 in a clockwise direction 14. Such backwards whirl can damage cutters and cause premature wear of drill bits. "Forward synchronous rotation" of the drill bit, which is a term used to describe rotation of the drill bit about the center of the borehole 10 in the same direction as the rotation of the drill bit and drill string as a whole, typically causes less damage and wear to drill bits when compared to backwards whirl. For example, FIG. 1B illustrates a borehole 10 with a drill bit 12 inside the borehole 10 experiencing forward synchronous rotation. The drill bit 12 is rotating about its axis 13 in a clockwise direction 16 and the drill bit 12 as a whole is also rotating about an axis 11 of the borehole 10 in a clockwise direction. Drill bits may be designed to encourage such forward synchronous rotation to avoid or reduce damage and wear. In addition, it may be desirable to cause the angular velocity of forward synchronous rotation to be, on average, about the same velocity as the rotation of the drill bit and drill string as a whole, although instantaneous velocities may deviate from one another slightly.

One technique to control bit whirl and reduce bit wear and damage is to design the drill bit to experience a net imbalance force (when in operation), or, in other words, a force in a direction that encourages forward synchronous rotation. The magnitude of the imbalance force may be designed to be within a target range of percentage of the WOB. So-called "high-imbalance" bits or "gun drill bits" have been introduced that have a region devoid of cutters to push the drill bit in a desired direction and at a desired force during operation. High-imbalance design of drill bits may be achieved through selectively tailoring the location and size of cutter devoid region, or otherwise selectively altering the imbalance force. For example, cutter rake angle, location or arrangement of cutters or abrasive particles, exposure of cutters (i.e., the distance a cutter cuts into the formation), size or orientation of blades on the drill bit, etc., may be altered to selectively alter the imbalance force.

DETAILED DESCRIPTION

The illustrations presented herein are not meant to be actual views of any particular material, apparatus, system, or method, but are merely idealized representations that are employed to describe certain embodiments of the present invention.

As used herein, the term "substantially" includes to a degree that one skilled in the art would understand the given parameter, property, or condition is met with a small degree of variance, such as within acceptable manufacturing tolerances.

As used herein, the phrase "earth-boring tool" includes an earth-boring drill bit, a drilling system (e.g., a drilling rig) including an earth-boring drill bit, and/or a component thereof.

As used herein, the phrase "drilling condition" means a hypothetical, predicted, or actual characteristic, feature, or condition of a drilling system (e.g., a drilling rig) and/or of a formation to be drilled. For example, "drilling conditions" based on drilling system characteristics, features, or conditions may be based on the capabilities or limitations of the drilling system to be used to drill the formation. By way of example, "drilling conditions" based on the drilling system may include values representing one or more of maximum torque, bit rotation speed (e.g., rotations per minute (RPM)), and weight on bit (WOB). By way of example, "drilling conditions" based on the formation to be drilled may include values representing one or more of a hardness of the formation to be drilled, an angle at which an earth-boring drill bit (referred to hereinafter as "drill bit") will proceed through a formation, bit offset from the borehole centerline, bit tilt, bit side load, and a type of formation to be drilled (including physical properties of the formation).

As used herein, the phrase "design variable" means a variable representing a characteristic, feature, or condition of a drill bit under design. "Design variable" includes a wear state variable and other design variables. As used herein, "wear state variable" means a variable that represents a wear state of the drill bit under design. Values for the wear state variable may be expressed in terms of, by way of a non-limiting example, a percentage of cutter face area that is worn away from an original, as-manufactured state due to wear in operation. For example, a "new" drill bit may have a wear state value of 0%, and a drill bit including at least one cutting element wherein half of the cutter face has worn away may have a wear state value of 50%. As used herein, the phrase "other design variables" means a plurality of variables other than the wear state variable that represent, by way of example, one or more of cutter size, cutter shape, cutter placement, cutter rake angle, cutter composition, number of cutters, cutter chamfer configuration, number of blades, size of blades, blade angle, blade spacing, bit profile, cone angle, bit composition, junk slot area, and hydraulics (e.g., nozzle size, number of nozzles, location of nozzles, etc.). Values for one or more of the design variables (e.g., one or more of the other design variables) may be adjusted during the design of the drill bit to enhance (e.g., improve, optimize) one or more performance parameters of the drill bit, as will be explained in more detail below.

As used herein, the phrase "performance parameter" means a value to be calculated and/or enhanced in the design of a drill bit based on drilling conditions and design variables. "Performance parameters" may include dynamic parameters of a drilling system or drill bit. By way of example, "performance parameters" may include one or more of force, imbalance force, dynamic stability, rate of penetration (ROP), area of cut, torque, torque curves, volume of rock removed by cutters and/or blades, and work rate curves. In addition or alternatively, "performance parameters" may include a so-called "Joe Kelly" number described in more detail in U.S. Pat. No. 3,491,844 to Kelly, Jr., issued Jan. 27, 1970, the disclosure of which is incorporated herein in its entirety by this reference.

Figure 2:
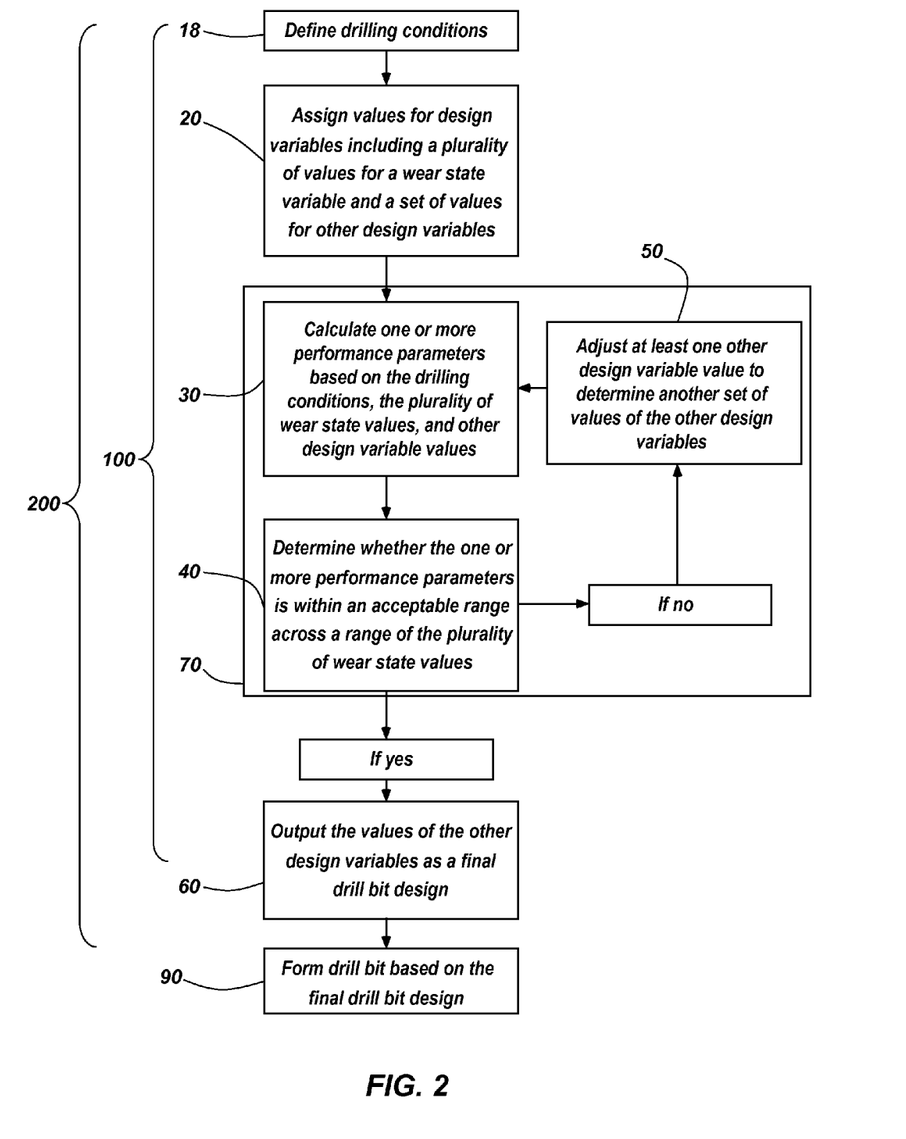
FIG. 2 is a flowchart showing methods of designing and forming an earth-boring drill bit according to embodiments of this disclosure.

A method 100 of designing an earth-boring tool according to at least one embodiment of the disclosure is illustrated with a flowchart in FIG. 2. The method 100 may be at least partially implemented with a computer. For example, the method 100 may be at least partially implemented with the assistance of a drilling simulation program on a computer. Such drilling simulation programs are known in the art and discussed, for example, in Hanson, J. M. and Hanson, W. R., 1995, "Dynamics Modeling of PDC Bits," 1995 SPE/IADC Drilling Conference, Amsterdam, and Dykstra et al., "Improving Drilling Performance by Applying Advanced Dynamics Models," 2001 SPE/IADC Drilling Conference, Amsterdam, each of which is incorporated herein in its entirety by this reference. The method 100 may include defining drilling conditions, illustrated as operation 18. The method 100 may also include assigning values for design variables, illustrated as operation 20. By way of example, assigning values for the design variables may include assigning a plurality of values for a wear state variable and assigning a set of values for other design variables (i.e., one value for each of the other design variables). The values may be based on experience (e.g., based on previously known drill bits used for drilling similar formations), intuition, and/or general rules of thumb, or the values may be chosen arbitrarily, as will be appreciated by one skilled in the art.

The method 100 may further include calculating one or more performance parameters based on the drilling conditions, the plurality of wear state values, and the other design variable values, illustrated as operation 30. The one or more performance parameters calculated may include, by way of example, one or more of a force, an imbalance force, a dynamic stability, an ROP, an area of cut, a torque, a torque curve, and a "Joe Kelly" number. The one or more performance parameters calculated may be chosen by one skilled in the art seeking to enhance (e.g., improve, optimize) the one or more performance parameters of the drill bit under design.

The operation 30 of calculating one or more performance parameters may be implemented with the assistance of a computer. For example, the calculating may be implemented with the assistance of a drilling simulation program on a computer. The calculating may include providing a result of the calculation as one or more of a list of numbers, a graph, a figure, a color, data points, etc., representing the one or more performance parameters at each of the plurality of wear state values (e.g., as a function of wear state variable) of the drill bit under design. In some embodiments, the results of the calculation may be kept in computer memory for further computer analysis, comparison, calculation, etc.

The method 100 of designing an earth-boring tool may further include determining whether the one or more performance parameters is within an acceptable range across a range of the plurality of wear state values, as illustrated in FIG. 2 by operation 40. As used herein, the phrase "within an acceptable range" includes within a range defined by at least one of a user of the method 100 (e.g., based on experience, target values of the one or more performance parameters, etc.) and tolerances and/or capabilities of a drilling system that will use the drill bit under design. The acceptable range or target values may be arbitrarily defined (e.g., selected, assigned). The acceptable range may be based on a balance between a plurality of factors, including by way of example, one or more of: target values; limitations, such as manufacturing feasibility, capabilities of a drilling system, cost, and restrictions imposed by other design variables; and the values of one or more other performance parameters different than the one or more performance parameters under review.

If the one or more performance parameters is within an acceptable range across a range of the plurality of wear states, then optionally the set of values of the other design variables may, without further enhancement (described in more detail below), be output as a final drill bit design, illustrated as operation 60. The operation 60 of outputting the final drill bit design may, in some embodiments, be inherently included in other operations of the method 100. In other words, after determining whether the one or more performance parameters is within an acceptable range, the user may note, select, and/or use the set of values of the other design variables that was used in the calculation of operation 30 as the final drill bit design without a separate operation of outputting the final drill bit design.

If, on the other hand, the one or more performance parameters is not within an acceptable range across a range of the plurality of wear states, then at least one other design variable value may be adjusted to determine another set of values of the other design variables, as illustrated by operation 50. The another set of values of the other design variables may be different than the set of values of the other design variables determined in operation 20 by the difference of one or more of the values of the other design variables. The operation 30 of calculating the one or more performance parameters may be repeated based on the drilling conditions, the plurality of wear state values, and the another set of values of the other design variables determined by operation 50. The method 100 may continue by determining 40 whether the one or more performance parameters calculated based on the another set of values of the other design variables is within an acceptable range across a range of wear state values. If so, the another set of values of the other design variables may be output 60 as the final drill bit design.

The operations 30, 40, and optionally 50 of calculating one or more performance parameters, determining whether the one or more performance parameters is within an acceptable range, and optionally adjusting the value of at least one other design variable may be repeated as many times as necessary, practical, or desired to determine a set of design variables yielding improved (e.g., acceptable) values for the one or more performance parameters across a range of the plurality of wear states. Such operations 30, 40, and optionally 50 may be referred to collectively as "enhancing"(e.g., improving, optimizing) the one or more performance parameters, illustrated as operation 70. Enhancing may be repeated as many times as necessary, practical, or desired to reach improved (e.g., acceptable) values of the one or more performance parameters across a range of the plurality of wear state values.

In some embodiments, the operation 40 of determining whether the one or more performance parameters is within the acceptable range across a range of the plurality of wear state values may be replaced by comparing the one or more performance parameters based on two or more sets of values of other design variables and selecting one of the two or more sets of values of other design variables in consideration of the comparison. Selecting may include determining whether the one or more performance parameters calculated based on the first set or on the second set is relatively closer to a target value across a range of the wear state values. In such embodiments, the method of designing a drill bit may include calculating one or more performance parameters based at least partially on the plurality of wear state values and a first set of other design variable values, adjusting the value of at least one of the other design variables to determine a second set of design variable values, and calculating the one or more performance parameters based at least partially on the plurality of wear state values and the second set of other design variable values.

The one or more performance parameters based on the first set of design variable values may be compared with the one or more performance parameters based on the second set of design variable values across a range of the plurality of wear state values. This comparison may be used to determine which of the first or second set of other design variable values yields a calculated one or more performance parameters closest to a target range or value across a range of wear state values of the bit under design. In other words, the one or more performance parameters may be compared to determine which of the first set of other design variable values and the second set of other design variable values yields improved performance compared to the other. Thus, rather than determining whether a single set of values of the other design variables is acceptable based on a target range or value of one or more performance parameters, two or more sets of values of other design variables may be compared to determine which has an improved performance parameter relative to the one or more other sets of other design variable values. The set that produces the one or more performance parameters closest to the target range or value over a range of wear state values may be selected and/or output as a final drill bit design.

Figure 3:
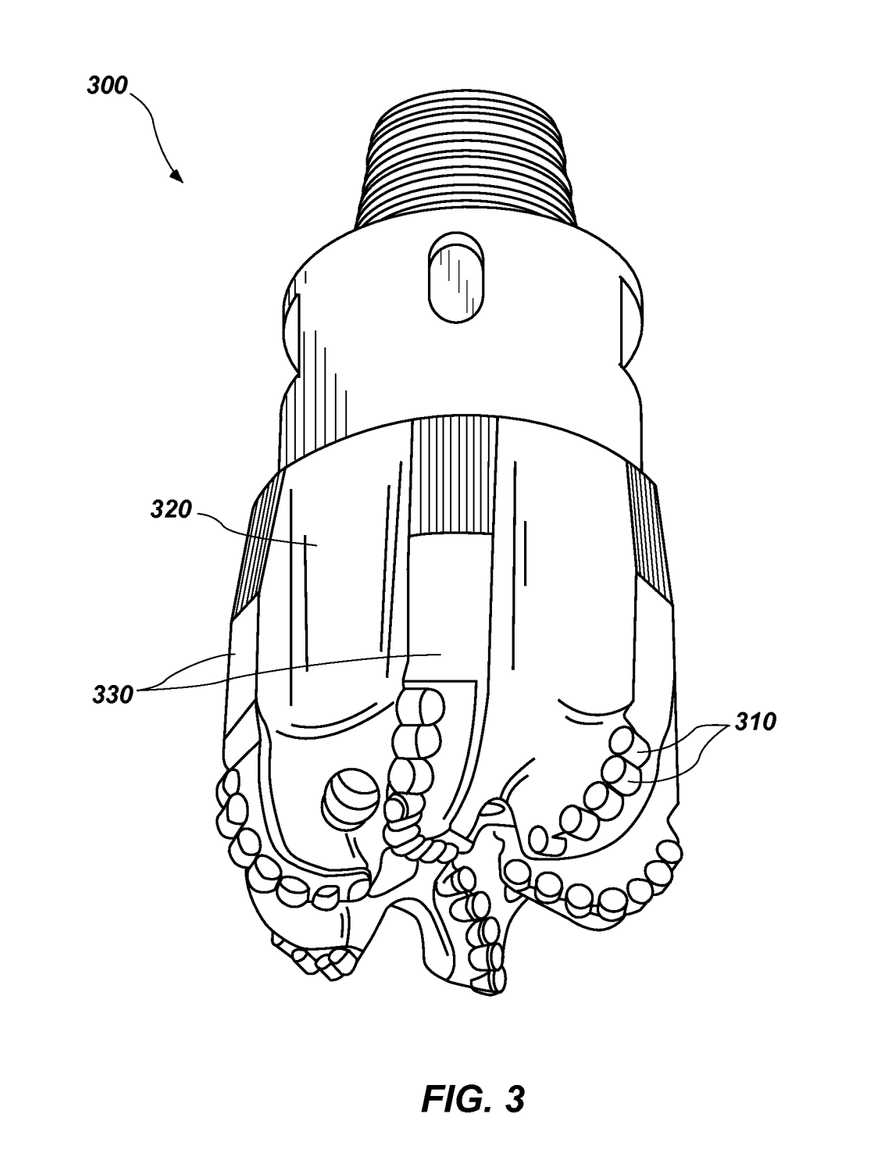
FIG. 3 is a perspective view of a drill bit formed according to an embodiment of this disclosure.

The disclosure also includes methods of forming an earth-boring tool. For example, a method 200 of forming an earth-boring tool may include the method 100 of designing the earth-boring tool of FIG. 2. According to at least one embodiment, the method 200 of forming an earth-boring tool may further include forming a drill bit (illustrated as operation 90) based on the final drill bit design output from the operation 60 of the method 100 of designing the earth-boring tool. Forming a drill bit based on the final drill bit design may include forming a drill bit with qualities (e.g., features, characteristics) that are at least substantially based on the values of the other design variables of the final drill bit design. By way of non-limiting example, the method 200 of forming an earth-boring tool may be used to form a drill bit 300 based on the output final drill bit design, as illustrated in FIG. 3. The drill bit 300 may have features based on the values of the other design variables of the final drill bit design. For example, features of the drill bit 300 based on the final drill bit design may include: the number, placement, orientation, and/or type of cutters 310; the length of a space 320 between adjacent blades 330; the number and/or shape of blades 330; or features based on any of the other design variables previously mentioned herein.

The disclosure is not limited to the particular flow or sequence of operations as has been described and illustrated in FIG. 2. In other words, one or more of the operations may be performed at a different time relative to other operations than has been particularly described and illustrated with reference to FIG. 2.

Figure 4:
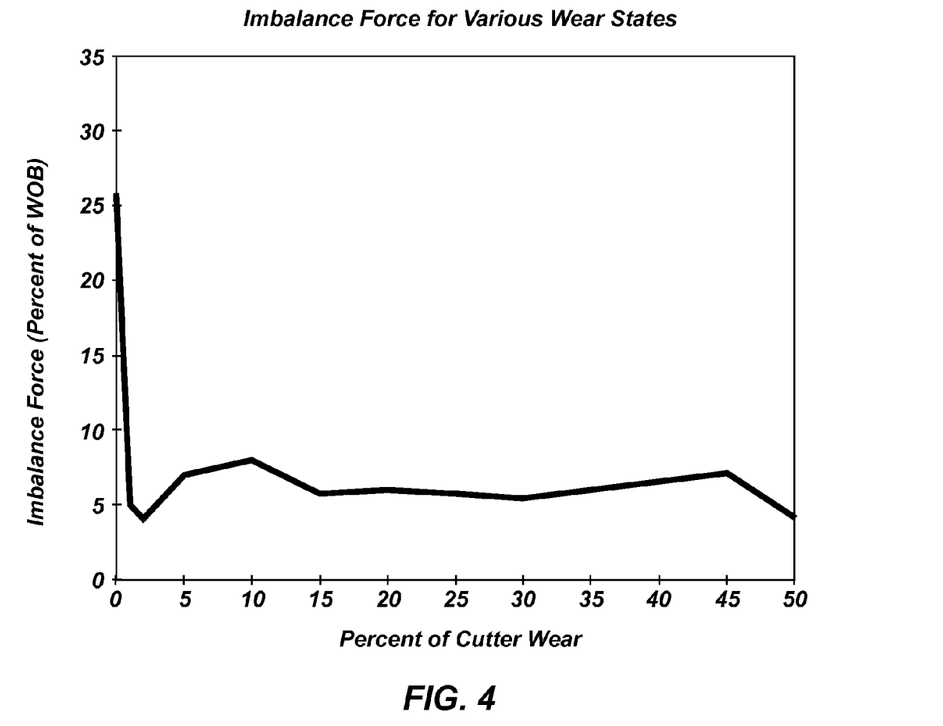
FIG. 4 is a graph showing the calculated imbalance force based on a plurality of wear state values and a first set of values of other design variables of an earth-boring drill bit according to an embodiment of this disclosure.
Figure 5:
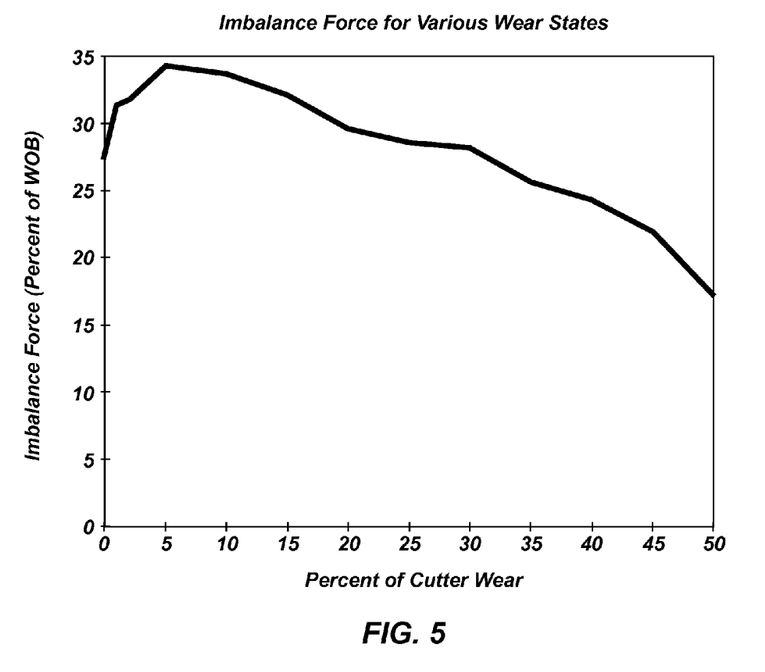
FIG. 5 is a graph showing the calculated imbalance force based on a plurality of wear state values and a second set of values of other design variables of an earth-boring drill bit according to an embodiment of this disclosure.

An embodiment of a method of designing an earth-boring tool including enhancing a particular performance parameter (e.g., a dynamic parameter) is illustrated in FIGS. 4 and 5. Methods of designing an earth-boring tool may include enhancing a dynamic parameter of a drill bit such that the dynamic parameter falls within an acceptable range or is closer to a target value. By way of example, the dynamic parameter may be an imbalance force that the drill bit under design may experience under certain design conditions. The imbalance force may be expressed as a percentage of WOB. A target imbalance force (e.g., an acceptable range of the imbalance force, an optimal imbalance force) may be an imbalance force that encourages the drill bit to experience forward synchronous rotation when drilling a formation to avoid or minimize damage and wear to the drill bit, although the disclosure is not so limited.

Drilling conditions may be defined, a plurality of values may be assigned for a wear state variable, and a first set of values may be assigned for other design variables, essentially as described above with reference to the operations 18 and 20 of FIG. 2. By way of non-limiting example and as shown in FIG. 4, the drilling conditions, the plurality of wear state values, and the first set of values of other design variables may be used to calculate the imbalance force of a drill bit under design at the plurality of wear state values of the drill bit under design. Such calculation may be performed with assistance of a drilling simulation program on a computer. The imbalance force may be expressed as the calculated percentage of WOB that the drill bit will experience in use (e.g., while drilling a formation). The plurality of wear state values may be expressed as a percentage of cutter wear, such as a percentage of area of a cutter that is removed due to wear (i.e., hypothetical or predicted wear). For example, a 0% wear state may represent a "new" bit such that the original, full area of the cutters on the bit remains. Similarly, a 5% wear state may represent a bit with 5% of the cutter area worn away. The imbalance force at each of the plurality of wear state values may be calculated and plotted on a graph to show an approximation of the imbalance force as a function of the wear state variable.

The graph may be analyzed to determine whether the imbalance force is within an acceptable range across a range of the wear state values. As illustrated in FIG. 4, and assuming for purposes of illustration a target range of imbalance force is between about 25% and about 30% of WOB, the calculated imbalance force may be within an acceptable range at a 0% wear state but drop off to an unacceptable imbalance force of between about 3% and about 10% of WOB over a range of about 1% to about 50% wear state values.

Although reference is made to a graph, the disclosure includes other expressions of data such as a list of numbers, a figure, a color, data points, storing data in computer memory, etc., representing the imbalance force at a plurality of wear states (e.g., as a function of wear states) of the bit under design. In other words, any expression of data that allows a computer or user to determine whether the imbalance force is within an acceptable range may be used in embodiments of this disclosure.

After having determined that the calculated imbalance force based on the first set of values of the other design variables is not within an acceptable range over a wide range of wear states, one or more of the values of the other design variables may be adjusted to determine a second set of values of the other design variables. The imbalance force may be calculated based at least partially on the second set of values of the other design variables and at the plurality of wear state values of the drill bit under design, resulting in FIG. 5, for example.

As can be seen in FIG. 5, the imbalance force based at least partially on the second set of values of the other design variables may be at or near the same percentage of WOB at 0% wear (i.e., between about 25% and about 30%) as the imbalance force of FIG. 4 based on the first set of values of the other design variables. However, the calculation of the imbalance force based on the second set of values of the other design variables may be different at other wear state values compared to the calculated imbalance force based on the first set of values of the other design variables. For example, and as shown in FIG. 5, the calculated imbalance force may be between about 15% and about 35% of WOB across a range of wear state values of 0% to 50%. In fact, the calculated imbalance force may be within or above the target range of about 25% to about 30% of WOB in the range of 0% to about 35% of wear. In other words, the calculated imbalance force based on the second set of values of the other design variables (FIG. 5) may be closer to the target imbalance force of between about 25% and about 30% of WOB than the calculated imbalance force based on the first set of values of the other design variables (FIG. 4) across a range of wear state values. Therefore, the second set of design variable values may be acceptable while the first set of design variable values may not be acceptable. Stated another way, the second set of values of the other design variables may lead to an enhanced (e.g., improved, optimized) imbalance force when compared to the first set of values of the other design variables. The second set of values of the other design variables may then be selected or output as a final drill bit design.

Alternatively, further enhancement (not shown) may be performed in an attempt to find a new set of values of the other design variables that leads to a calculated imbalance force that is even closer to a target range or value across a range of wear state values than that shown in FIG. 5. A method essentially the same as that described above with reference to FIGS. 4 and 5 may be used to compare the calculated imbalance force of the second set of values of the other design variables to the calculated imbalance force of the new set of values of the other design variables. In other words, the operations described with reference to FIGS. 4 and 5 may be repeated as many times as necessary, desired, and/or practical to determine a set of values of other design variables that leads to an acceptable or enhanced imbalance force, as will be understood by a person skilled in the art.

The methods described in this disclosure may offer advantages over prior known methods. Some prior known methods of designing a drill bit include calculating a performance parameter while assuming the drill bit under design is in a "new" state (e.g., a 0% wear state, an unworn state). In reality, cutting elements on a drill bit may wear down and the performance parameter may change as a result of the wear. The methods of this disclosure may produce a more favorable drill bit design for operation at a range of wear states. For example, a calculated imbalance force while the drill bit is in a "new" state may be within a target range, such as, for example, 25% to 30% of WOB. Prior known methods of bit design may have found such a calculated imbalance force to be satisfactory and stopped further enhancement of the imbalance force. However, as can be seen in FIG. 4 and using an embodiment of this disclosure, determining the imbalance force at a plurality of wear states illustrates that the same drill bit design may experience a large and abrupt reduction in imbalance force as the drill bit wears. In some cases, the reduction in imbalance force may occur with as little as about 1% of cutter wear or less. For example, the calculated imbalance force based on a first set of values of other design variables may drop from between about 25% and about 30% of WOB to about 5% of WOB after about 1% of cutter wear. The calculated imbalance force may remain at between about 3% and about 10% of WOB based on percentages of cutter wear between about 1% and about 50%. In other words, calculating the imbalance forced based on a first set of values of other design variables at a plurality of percentages of cutter wear may indicate that the values of the other design variables of the first set may need to be adjusted to maintain the imbalance force closer to a target range or value of imbalance forces (e.g., at an acceptable range, at an enhanced range), even though the calculated imbalance force at the "new" state is within a target range.

Furthermore, if prior known methods were used with the two sets of values of the other design variables used to produce the graphs of FIGS. 4 and 5, either set of values of the other design variables would be equally acceptable because each has a calculated imbalance force between about 25% and about 30% (assuming this is the target range) in a "new" state. However, an embodiment of this disclosure including calculating the imbalance force at a plurality of wear state values shows that the set of values of the other design variables upon which FIG. 5 is based is superior to the set of values of the other design variables upon which FIG. 4 is based because the imbalance force is closer to the target range across a much larger range of wear state values in FIG. 5 as compared to FIG. 4.

Assuming a different target range for the imbalance force of between about 5% and about 10% of WOB also shows advantages of embodiments of this disclosure over prior known methods. Based on an assumption of a target imbalance force between about 5% and about 10%, the set of values of other design variables upon which FIG. 4 is based may be acceptable while the set of values of other design variables upon which FIG. 5 is based may be unacceptable. Although both result in a calculated imbalance force higher than the target range in the "new" state, the calculated imbalance force of FIG. 4 is at or near the target range for a wide range of wear state values. On the other hand, the calculated imbalance force of FIG. 5 is not at or near the target range of imbalance force across a wide range of wear state values. Prior known methods may result in a rejection of both sets of values of other design variables (i.e., the sets of values of other design variables upon which FIGS. 4 and 5 are based, respectively) because the calculated imbalance force may be too high in a "new" state for either set of values of the other design variables. In contrast, the methods of this disclosure show that the set of values of the other design variables upon which FIG. 4 is based may be acceptable as a result of analyzing the calculated imbalance force at a plurality of wear state values. Therefore, the methods of this disclosure may be more efficient, cost-effective, and/or accurate than prior known methods. Furthermore, the methods of this disclosure may be used to design an earth-boring tool that has a longer usable life and enhanced performance compared to prior known methods.

Embodiments of the present invention, therefore, may find use in any application in which a performance parameter of an earth-boring tool may be enhanced. Specifically, embodiments of this disclosure may be used to design any earth-boring tool, such as a roller cone drill bit (e.g., a tri-cone bit), an impregnated (e.g., diamond impregnated, cubic boron nitride impregnated) drill bit, a fixed-cutter bit, a hybrid bit, a core bit, or any other earth-boring tool known to those skilled in the art. Furthermore, embodiments of this disclosure may be used in the enhancement of any performance parameter of an earth-boring tool, such as, for example, an imbalance force, a torque, a torque curve, dynamic stability, an ROP, an area of cut, a "Joe Kelly" number, or any other performance parameter previously mentioned herein.

While the present invention has been described herein with respect to certain embodiments, those skilled in the art will recognize and appreciate that it is not so limited. Rather, many additions, deletions, and modifications to the embodiments depicted and described herein may be made without departing from the scope of the invention as hereinafter claimed, and legal equivalents of the invention. In addition, features from one embodiment may be combined with features of another embodiment while still being encompassed within the scope of the invention as contemplated by the inventors. Furthermore, the invention has utility in conjunction with earth-boring drill bits having different bit profiles as well as different cutter types.

What is claimed is:

1. A method of designing an earth-boring tool, comprising:
    assigning values for design variables of an earth-boring drill bit including a plurality of values of a wear state variable and a first set of values of other design variables;
    using a computer to generate a plot of one or more performance parameters of the earth-boring drill bit based on drilling conditions, the plurality of values of the wear state variable, and the first set of values of other design variables for the earth-boring drill bit;
    using the generated plot and selecting at least one of the values of the first set of values of other design variables for incorporation into a computer model of the earth-boring drill bit; and
    generating the computer model of the earth-boring drill bit based on the selected at least one of the values of the first set of design variables for other design variables.

2. The method of claim 1, further comprising adjusting the value of at least one other design variable of the first set of values to determine a second set of values of the other design variables different than the first set of values.

3. The method of claim 2, further comprising calculating the one or more performance parameters of the earth-boring drill bit based on the drilling conditions, the plurality of values of the wear state variable, and the second set of values of the other design variables.

4. The method of claim 1, wherein using the generated plot and selecting at least one of the values of the first set of values of other design variables for incorporation into a computer model of the earth-boring drill bit comprises determining that the one or more performance parameters is within a target range across a range of the plurality of wear states.

5. The method of claim 1, wherein the one or more performance parameters comprises an imbalance force.

6. The method of claim 5, wherein using a computer to generate a plot of one or more performance parameters comprises generating a plot of the imbalance force expressed as a percentage of weight-on-bit.

7. A method of enhancing a performance parameter in the design of an earth-boring tool, the method comprising:
    calculating, with the assistance of a computer, a performance parameter of an earth-boring tool under design based at least partially on values of design variables including a plurality of values of a wear state variable and a first set of values of other design variables of the drill bit under design;
    calculating, with the assistance of a computer, the performance parameter based at least partially on values of design variables including a second set of values of the other design variables and the plurality of values of the wear state variable, the second set of values of the other design variables different than the first set of values of other design variables;
    comparing the performance parameter based at least partially on the first set of values of other design variables with the performance parameter based at least partially on the second set of values of the other design variables; and
    selecting one of the first and second sets of values of the other design variables in consideration of the comparison.

8. The method of claim 7, further comprising adjusting a value of at least one of the other design variables of the first set of values of other design variables to determine the second set of values of the other design variables.

9. The method of claim 7, wherein selecting one of the first and second sets of values of the other design variables in consideration of the comparison comprises determining whether the one or more performance parameters calculated based on the first set or on the second set is closer to a target value across a range of the wear state values than the one or more performance parameters calculated based on the other of the first set and the second set.

10. The method of claim 7, further comprising:

generating a first plot of the performance parameter based at least partially on the first set of values of other design variables and the plurality of values of the wear state variable; and generating a second plot of the performance parameter based at least partially on the second set of values of the other design variables and the plurality of values of the wear state variable.

11. The method of claim 10, wherein comparing the performance parameter based at least partially on the first set of values of other design variables with the performance parameter based at least partially on the second set of values of the other design variables comprises comparing the first plot with the second plot.

12. A method of forming an earth-boring tool, comprising:
designing an earth-boring tool, comprising:
enhancing at least one dynamic parameter of the earth-boring tool comprising:
calculating a first value of the at least one dynamic parameter based at least partially on at least one design variable value and a plurality of values of a wear state variable of the earth-boring tool; and
adjusting the at least one design variable value and calculating a second value of the at least one dynamic parameter based at least partially on the adjusted at least one design variable value and the plurality of values of the wear state variable of the earth-boring tool; and
outputting a design of the earth-boring tool based on the enhancement; and
designing the earth-boring tool based at least in part on the design.

13. The method of claim 12, wherein the enhancing the at least one dynamic parameter comprises enhancing an imbalance force of the earth-boring tool.

14. The method of claim 12, wherein outputting a design of the earth-boring tool based on the enhancement comprises outputting a set of values of design variables used in the enhancement of the at least one dynamic parameter.

* * * * *

UNITED STATES PATENT AND TRADEMARK OFFICE
CERTIFICATE OF CORRECTION

PATENT NO. : 8,818,775 B2  
APPLICATION NO. : 13/204402  
DATED : August 26, 2014  
INVENTOR(S) : Endres et al.

Page 1 of 1

It is certified that error appears in the above-identified patent and that said Letters Patent is hereby corrected as shown below:

In the claims:

| | | | |
|---|---|---|---|
| CLAIM 12, | COLUMN 12, | LINE 5, | delete "calculating" insert --calculating, with a computer,-- |
| CLAIM 12, | COLUMN 12, | LINE 10, | delete "calculating" insert --calculating, with a computer,-- |

Signed and Sealed this  
Fourteenth Day of July, 2015

Michelle K. Lee  
*Director of the United States Patent and Trademark Office*